United States Patent
Kim et al.

(10) Patent No.: US 9,214,548 B1
(45) Date of Patent: Dec. 15, 2015

(54) HIGH VOLTAGE INTEGRATED DEVICES, METHODS OF FABRICATING THE SAME, ELECTRONIC DEVICES INCLUDING THE SAME, AND ELECTRONIC SYSTEMS INCLUDING THE SAME

(71) Applicant: SK hynix Inc., Gyeonggi-do (KR)

(72) Inventors: Chul Kim, Chungcheongbuk-do (KR); Han Ju Oh, Chungcheongbuk-do (KR); Seong Hun Kang, Gyeonggi-do (KR); Hyoung Nam Lim, Seoul (KR); Sang Duk Kim, Chungcheongbuk-do (KR); Kyung Hwan Kim, Chungcheongbuk-do (KR); Jung Su Jin, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/696,072

(22) Filed: Apr. 24, 2015

(30) Foreign Application Priority Data

Nov. 7, 2014 (KR) .......................... 10-2014-0154784

(51) Int. Cl.
| | |
|---|---|
| *H01L 29/94* | (2006.01) |
| *H01L 21/8238* | (2006.01) |
| *H01L 29/78* | (2006.01) |
| *H01L 29/10* | (2006.01) |
| *H01L 27/088* | (2006.01) |
| *H01L 29/66* | (2006.01) |

(52) U.S. Cl.
CPC .......... *H01L 29/7816* (2013.01); *H01L 27/088* (2013.01); *H01L 29/1037* (2013.01); *H01L 29/1045* (2013.01); *H01L 29/66681* (2013.01)

(58) Field of Classification Search
CPC .............. H01L 29/7816; H01L 27/088; H01L 29/1045; H01L 29/66681
USPC .......................................... 257/329; 438/212
See application file for complete search history.

(56) References Cited

U.S. PATENT DOCUMENTS

| | | | |
|---|---|---|---|
| 6,274,457 B1 | 8/2001 | Sakai et al. | |
| 8,174,071 B2* | 5/2012 | Tien | ............. H01L 29/4236 257/343 |
| 8,853,022 B2* | 10/2014 | Zhang | ............. H01L 29/4983 257/335 |
| 2007/0054464 A1* | 3/2007 | Zhang | ............. H01L 21/76229 438/424 |
| 2015/0097236 A1* | 4/2015 | Tsai | ............. H01L 29/66681 257/339 |

* cited by examiner

*Primary Examiner* — Luan C Thai
(74) *Attorney, Agent, or Firm* — IP & T Group LLP

(57) ABSTRACT

A high voltage integrated device includes a drift region in a substrate, a source region in the substrate and spaced apart from the drift region, a drain region in the drift region, a trench insulation layer in the drift region between the source region and the drain region, and a gate insulation layer and a gate electrode sequentially stacked on the substrate between the source region and the drift region and extending onto the trench insulation layers. The upper sidewall of the first trench insulation layer has a first angle to the bottom surface thereof and the lower sidewall of the first trench insulation layer has a second angle, which is smaller than the first angle, to the bottom surface thereof.

12 Claims, 11 Drawing Sheets

HIGH VOLTAGE INTEGRATED DEVICES, METHODS OF FABRICATING THE SAME, ELECTRONIC DEVICES INCLUDING THE SAME, AND ELECTRONIC SYSTEMS INCLUDING THE SAME

CROSS-REFERENCE TO RELATED APPLICATION

The present application claims priority under 35 U.S.C 119(a) to Korean Patent Application No. 10-2014-0154784, filed on Nov. 7, 2014, in the Korean Intellectual Property Office, which is incorporated herein by reference in its entirety.

BACKGROUND

1. Technical Field

Various embodiments of the present disclosure relate to semiconductor integrated circuits and, more particularly, to high voltage integrated devices, methods of fabricating the same, electronic devices including the same, and electronic systems including the same.

2. Related Art

Integrated circuits having functions of both controllers and drivers may be employed in smart power devices. Output circuits of the smart power devices may be designed to include Lateral Double-diffused MOS (LDMOS) transistors operating at high voltages. Thus, breakdown voltages of the LDMOS transistors, for example, a drain junction breakdown voltage and a gate dielectric breakdown voltage are important factors that may directly influence the stability of LDMOS transistors. In addition, on-resistance (Ron) of the LDMOS transistors is also an important factor that may influence electrical characteristics of the LDMOS transistors, for example, the current drivability of the LDMOS transistors. To increase the drain junction breakdown voltage of the LDMOS transistors, the doping concentration of a drift region between a drain region and a channel region is to be reduced or the drift length of carriers in the drift region (corresponding to a length of a current path in the drift region) is to be increased. However, the current drivability of the LDMOS transistors may be degraded resulting in an increase of the on-resistance (Ron) of the LDMOS transistors. In contrast, if the doping concentration of the drift region increases or the drift length in the drift region decreases, the on-resistance (Ron) of the LDMOS transistors may be reduced to improve the current drivability of the LDMOS transistors. However, the drain junction breakdown voltages of the LDMOS transistors may be lowered. That is, in the LDMOS transistors, the on-resistance and the drain junction breakdown voltage may have a trade-off relationship.

SUMMARY

Various embodiments are directed to high voltage integrated devices, methods of fabricating the same, electronic devices including the same, and electronic systems including the same.

According to an embodiment, a high voltage integrated device includes a first channel region disposed in an upper region of a substrate, a first drift region disposed in the upper region of the substrate to be adjacent to a side of the first channel region, a first source region disposed in the upper region of the substrate to be in contact with the other side of the first channel region and opposite to the first drift region, a first drain region disposed in an upper region of the first drift region, a first trench insulation layer disposed in the upper region of the first drift region between the first channel region and the first drain region, and a first gate insulation layer and a first gate electrode sequentially stacked on the first channel region and disposed to extend onto the first trench insulation layer, wherein the first trench insulation layer has a dual-sloped sidewall profile which is defined by upper and lower sidewalls having different angles to a bottom surface thereof.

According to another embodiment, a method of fabricating a high voltage integrated device includes forming a body region and a drift region in an upper region of a substrate to be spaced apart from each other, forming a trench having a predetermined depth in the drift region, the trench being formed to have a dual-sloped sidewall profile which is defined by upper and lower sidewalls having different angles to a bottom surface thereof, forming a trench insulation layer in the trench, sequentially forming a gate insulation layer and a gate electrode on a top surface of a portion of the body region adjacent to the drift region and a top surface of the substrate between the body region and the drift region, the gate insulation layer and the gate electrode being formed to extend onto the trench insulation layer, and forming a source region and a drain region in the body region and the drift region, respectively.

According to another embodiment, an electronic device includes a high voltage integrated circuit suitable for generating an output signal in response to an input signal and a high voltage integrated device suitable for executing a switching operation in response to the output signal of the high voltage integrated circuit, wherein the high voltage integrated device includes a channel region disposed in an upper region of a substrate, a drift region disposed in the upper region of the substrate to be adjacent to a side of the channel region, a source region disposed in the upper region of the substrate to be in contact with the other side of the channel region and opposite to the drift region, a drain region disposed in an upper region of the drift region, a trench insulation layer disposed in the upper region of the drift region between the channel' region and the drain region, and a gate insulation layer and a gate electrode sequentially stacked on the channel region and disposed to extend onto the trench insulation layer, wherein the trench insulation layer has a dual-sloped sidewall profile which is defined by upper and lower sidewalls having different angles to a bottom surface thereof.

According to another embodiment, an electronic system includes a mobile station modem and a power management integrated circuit suitable for supplying a power supply voltage to the mobile station modem and suitable for employing a high voltage integrated device as a switching device, wherein the high voltage integrated device includes a channel region disposed in an upper region of a substrate, a drift region disposed in the upper region of the substrate to be adjacent to a side of the channel region, a source region disposed in the upper region of the substrate to be in contact with the other side of the channel region and opposite to the drift region, a drain region disposed in an upper region of the drift region, a trench insulation layer disposed in the upper region of the drift region between the channel region and the drain region, and a gate insulation layer and a gate electrode sequentially stacked on the channel region and disposed to extend onto the trench insulation layer, wherein the trench insulation layer has a dual-sloped sidewall profile which is defined by upper and lower sidewalls having different angles to a bottom surface thereof.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

In complementary metal-oxide-semiconductor (CMOS) technologies, a trench insulation layer such as a shallow trench isolation (STI) layer may be widely used to define active regions, which are electrically isolated from each other, in a silicon substrate. If the CMOS technologies are applied to high voltage integrated devices such as Lateral Double-diffused MOS (LDMOS) transistors, the trench insulation layer may be used, not only to isolate the adjacent high voltage integrated devices from each other, but also to alleviate a surface electric field created in the high voltage integrated devices. This trench insulation layer may suppress an electric field crowding phenomenon occurring at surfaces of the high voltage integrated devices to improve drain junction breakdown voltage characteristics and gate dielectric breakdown voltage characteristics of the high voltage integrated devices. Meanwhile, carriers in each of the high voltage integrated devices may drift along a bottom surface and sidewalls of the trench insulation layer in a drift region between a source region and a drain region. If a drift length of the carriers increases, on-resistance (Ron) characteristics of the high voltage integrated devices may be degraded. According to the following embodiments, the trench insulation layer may be formed to have dual-sloped sidewalls so that lower sidewalls of the trench insulation layer may be less steep than upper sidewalls of the trench insulation layer. Thus, the trench insulation layer may improve on-resistance (Ron) characteristics of the high voltage integrated devices while minimizing degradation of the drain junction breakdown voltage characteristics of the high voltage integrated devices.

It will be understood that although the terms such as first, second, third etc. may be used herein to describe various elements, these elements are not limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may be directly in contact with the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
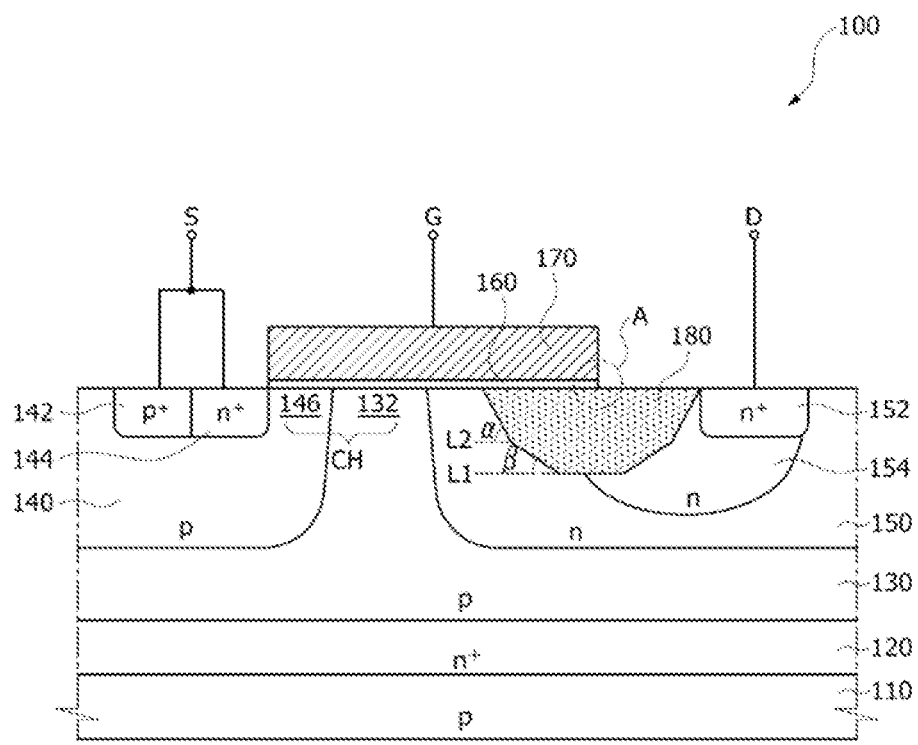
FIG. 1 is a cross-sectional view illustrating a high voltage integrated device according to an embodiment.

FIG. 1 is a cross-sectional view illustrating a high voltage integrated device 100 according to an embodiment. Referring to FIG. 1, the high voltage integrated device 100 may correspond to an LDMOS transistor and may include an N-type buried layer 120 disposed on a P-type substrate 110. A P-type semiconductor layer 130, for example, a P-type silicon layer may be disposed on the N-type buried layer 120. The P-type semiconductor layer 130 may be an epitaxial layer formed by an epitaxial process. A P-type body region 140 and an N-type drift region 150 may be disposed in an upper region of the P-type semiconductor layer 130 to be spaced apart from each other. Sidewalls and bottom surfaces of the P-type body region 140 and the N-type drift region 150 may be surrounded by the P-type semiconductor layer 130. A P-type body contact region 142 and an N-type source region 144 may be disposed in an upper region of the P-type body region 140. A sidewall of the P-type body contact region 142 may be in contact with a sidewall of the N-type source region 144. The P-type body contact region 142 and the N-type source region 144 may be electrically connected to a source terminal S through a predetermined contact.

An upper region of the P-type body region 140 between the N-type source region 144 and the P-type semiconductor layer 130 may act as a first channel region 146 in which an inversion channel layer is formed under certain conditions. An upper region of the P-type semiconductor layer 130 between the P-type body region 140 and the N-type drift region 150 may act as a second channel region 132 in which an inversion channel layer is formed under certain conditions. The first and second channel regions 146 and 132 may constitute a channel region CH of the high voltage integrated device 100. An N-type drain region 152 may be disposed in an upper region of the N-type drift region 150. The N-type drain region 152 may be electrically connected to a drain terminal D through a predetermined contact. The N-type drain region 152 may be exposed at a top surface of the N-type drift region 150. A trench insulation layer 180 may be disposed in an upper region of the N-type drift region 150. The trench insulation layer 180 may be exposed at the top surface of the N-type drift region 150. That is, a top surface of the trench insulation layer 180 may be coplanar with the top surface of the N-type drift region 150. Sidewalls and a bottom surface of the N-type drain region 152 as well as a sidewall and a bottom surface of the trench insulation layer 180 may be surrounded by an N-type diffusion region 154. The N-type diffusion region 154 may be an extension region that extends from the N-type drain region 152. An impurity concentration of the N-type diffusion region 154 may be lower than an impurity concentration of the N-type drain region 152 and may be higher than an impurity concentration of the N-type drift region 150.

A gate insulation layer 160 and a gate electrode 170 may be sequentially stacked on the channel region CH including the first and second channel regions 146 and 132. The gate insulation layer 160 and the gate electrode 170 may extend onto a top surface of the N-type drift region 150 and a top surface of the trench insulation layer 180. The one ends of the gate insulation layer 160 and the gate electrode 170, which are adjacent to the N-type drain region 152 among the both ends, may be located on the trench insulation layer 180, as illustrated in a portion 'A' of FIG. 1. Thus, the trench insulation layer 180 may suppress an electric field crowding phenomenon occurring at an edge of the gate electrode 170 which is adjacent to the N-type drain region 152, thereby improving drain junction breakdown voltage characteristics and gate dielectric breakdown voltage characteristics of the high voltage integrated device 100. The gate electrode 170 may be electrically connected to a gate terminal G through a predetermined contact. In some embodiments, the gate insulation layer 160 may include an oxide layer, and the gate electrode 170 may include a polysilicon layer. The polysilicon layer may be doped with impurities.

Each of sidewalls of the trench insulation layer 180 may have a dual-sloped profile. That is, a first slope of upper sidewalls of the trench insulation layer 180 may be different from a second slope of lower sidewalls of the trench insulation layer 180. In the present embodiment, the first slope may be greater than the second slope. The second slope may be defined by a second angle between the lower sidewall of the trench insulation layer 180 and a first line L1 (i.e., a horizontal line) horizontally extending from the bottom surface of the trench insulation layer 180, and the first slope may be defined by a first angle α between the upper sidewall of the trench insulation layer 180 and a second line L2 (i.e., a horizontal line) parallel with the first line L1. In some embodiments, the first angle α may be within the range of about 55 degrees to about 59 degrees, and the second angle β may be within the range of about 24 degrees to about 28 degrees. Since the trench insulation layer 180 has the dual-sloped sidewalls, the drift length of carriers in the drift region 150 may be reduced as compared with when the trench insulation layer 180 has vertical sidewalls or single-sloped sidewalls with the first angle α. As a result, on-resistance (Ron) characteristics of the high voltage integrated device 100 may be improved. Moreover, the sharpness of lower corners of the trench insulation layer 180 may be dulled because of the presence of the lower sidewall of the trench insulation layer 180. Accordingly, an electric field crowding phenomenon occurring at corners of the trench insulation layer 180 may be suppressed.

Figure 2:
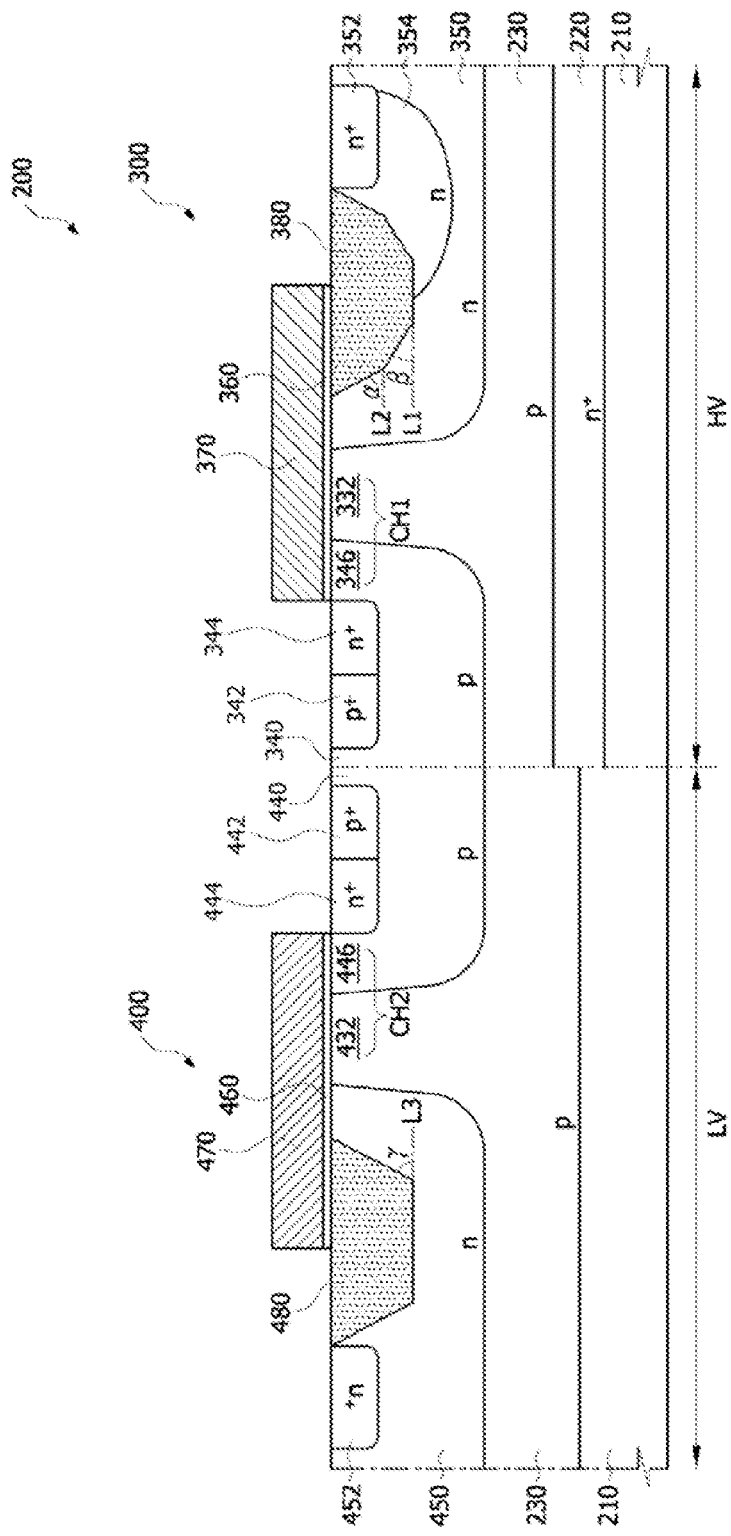
FIG. 2 is a cross-sectional view illustrating a high voltage integrated device according to another embodiment.

FIG. 2 is a cross-sectional view illustrating a high voltage integrated device 200 according to another embodiment. Referring to FIG. 2, the high voltage integrated device 200 may include a first high voltage integrated device 300 and a second high voltage integrated device 400 which are disposed in a single substrate 210. The substrate 210 may be P-type. The first high voltage integrated device 300 may have an operation voltage which is higher than an operation voltage of the second high voltage integrated device 400. Thus, the first high voltage integrated device 300 may be disposed in a high voltage region HV of the substrate 210, and the second high voltage integrated device 400 may be disposed in a low voltage region LV of the substrate 210. Although not shown in FIG. 2, the high voltage region HV may be electrically isolated from the low voltage region LV. For example, an N-type sink region (not shown) may be disposed to penetrate a P-type semiconductor layer 230 that is disposed in an upper region of the P-type substrate 210 between the high voltage region HV and the low voltage region LV. The high voltage region HV may be electrically isolated from the low voltage region LV by the N-type sink region and an N-type buried layer 220 disposed between the P-type semiconductor layer 230 and the P-type substrate 210. The N-type buried layer 220 may be disposed only in the high voltage region HV.

The first high voltage integrated device 300 disposed in the high voltage region HV may correspond to an LDMOS transistor and may include the P-type semiconductor layer 230 (e.g., a P-type silicon layer) disposed on a surface of the N-type buried layer 220 which is formed on the P-type substrate 210. The P-type semiconductor layer 230 may be an epitaxial layer formed by an epitaxial process. A P-type body region 340 and an N-type drift region 350 may be disposed in an upper region of the P-type semiconductor layer 230 to be spaced apart from each other. Sidewalls and bottom surfaces of the P-type body region 340 and the N-type drift region 350 may be surrounded by the P-type semiconductor layer 230. A P-type body contact region 342 and an N-type source region 344 may be disposed in an upper region of the P-type body region 340. A sidewall of the P-type body contact region 342 may be in contact with a sidewall of the N-type source region 344.

An upper region of the P-type body region 340 between the N-type source region 344 and the P-type semiconductor layer 230 may act as a first channel region 346 in which an inversion channel layer is formed under certain conditions. An upper region of the P-type semiconductor layer 230 between the P-type body region 340 and the N-type drift region 350 may act as a second channel region 332 in which an inversion channel layer is formed under certain conditions. The first and second channel regions 346 and 332 may constitute a channel region CH1 of the first high voltage integrated device 300. An N-type drain region 352 may be disposed in an upper region of the N-type drift region 350. The N-type drain region 352 may be exposed at a top surface of the N-type drift region 350. A trench insulation layer 380 may be disposed in an upper region of the N-type drift region 350. The trench insulation layer 380 may be exposed at the top surface of the N-type drift region 350. That is, a top surface of the trench insulation layer 380 may be coplanar with the top surface of the N-type drift region 350. Sidewalls and a bottom surface of the N-type drain region 352 as well as a sidewall and a bottom surface of the trench insulation layer 380 may be surrounded by an N-type diffusion region 354. The N-type diffusion region 354 may be an extension region that extends from the N-type drain region 352. An impurity concentration of the N-type diffusion region 354 may be lower than an impurity concentration of the N-type drain region 352 and may be higher than an impurity concentration of the N-type drift region 350.

A gate insulation layer 360 and a gate electrode 370 may be sequentially stacked on the channel region CH1 including the first and second channel regions 346 and 332. The gate insulation layer 360 and the gate electrode 370 may extend onto a top surface of the N-type drift region 350 and a top surface of the trench insulation layer 380. The one ends of the gate insulation layer 360 and the gate electrode 370, which are adjacent to the N-type drain region 352 among the both ends, may be located on the trench insulation layer 380. Thus, the trench insulation layer 380 may suppress an electric field crowding phenomenon occurring at an edge of the gate electrode 370 which is adjacent to the N-type drain region 352, thereby improving drain junction breakdown voltage characteristics and gate dielectric breakdown voltage characteristics of the first high voltage integrated device 300. In some embodiments, the gate insulation layer 360 may include an oxide layer, and the gate electrode 370 may include a polysilicon layer. The polysilicon layer may be doped with impurities.

Each of sidewalls of the trench insulation layer 380 may have a dual-sloped profile. That is, a first slope of upper sidewalls of the trench insulation layer 380 may be different from a second slope of lower sidewalls of the trench insulation layer 380. In the present embodiment, the first slope may be greater than the second slope. The second slope may be defined by a second angle β between the lower sidewall of the trench insulation layer 380 and a first line L1. (i.e., a horizontal line) horizontally extending from the bottom surface of the trench insulation layer 380, and the first slope may be defined by a first angle between the upper sidewall of the trench insulation layer 380 and a second line L2 (i.e., a horizontal line) parallel with the first line L1. In some embodiments, the first angle α may be within the range of about 55 degrees to about 59 degrees, and the second angle may be within the range of about 24 degrees to about 28 degrees. Since the trench insulation layer 380 has the dual-sloped sidewalls, the drift length of carriers in the drift region 350 may be reduced as compared to when the trench insulation layer 380 has vertical sidewalls or single-sloped sidewalls with the first angle α. As a result, on-resistance (Ron) characteristics of the first high voltage integrated device 300 may be improved. Moreover, the sharpness of lower corners of the trench insulation layer 380 may become dulled because of the presence of the lower sidewall of the trench insulation layer 380. Accordingly, an electric field crowding phenomenon occurring at corners of the trench insulation layer 380 may be suppressed.

The second high voltage integrated device 400 disposed in the low voltage region LV may correspond to an LDMOS transistor and may include the P-type semiconductor layer 230 (e.g., a P-type silicon layer) disposed on the P-type substrate 210. The P-type semiconductor layer 230 may be an epitaxial layer formed by an epitaxial process. The P-type semiconductor layer 230 in the low voltage region LV and the P-type semiconductor layer 230 in the high voltage region HV may be the same layer. A P-type body region 440 and an N-type drift region 450 may be disposed in an upper region of the P-type semiconductor layer 230 to be spaced apart from each other. Sidewalls and bottom surfaces of the P-type body region 440 and the N-type drift region 450 may be surrounded by the P-type semiconductor layer 230. A P-type body contact region 442 and an N-type source region 444 may be disposed in an upper region of the P-type body region 440. A sidewall of the P-type body contact region 442 may be in contact with a side wall of the N-type source region 444.

An upper region of the P-type body region 440 between the N-type source region 444 and the P-type semiconductor layer 230 may act as a first channel region 446 in which an inversion channel layer is formed under certain conditions. An upper region of the P-type semiconductor layer 230 between the P-type body region 440 and the N-type drift region 450 may act as a second channel region 432 in which an inversion channel layer is formed under certain conditions. The first and second channel regions 446 and 432 may constitute a channel region CH2 of the second high voltage integrated device 400. An N-type drain region 452 may be disposed in an upper region of the N-type drift region 450. The N-type drain region 452 may be exposed at a top surface of the N-type drift region 450. A trench insulation layer 480 may be disposed in an upper region of the N-type drift region 450. The trench insulation layer 480 may be exposed at the top surface of the N-type drift region 450. That is, a top surface of the trench insulation layer 480 may be coplanar with the top surface of the N-type drift region 450.

A gate insulation layer 460 and a gate electrode 470 may be sequentially stacked on the channel region CH2 including the first and second channel regions 446 and 432. The gate insulation layer 460 and the gate electrode 470 may extend onto a top surface of the N-type drift region 450 and a top surface of the trench insulation layer 480. The one ends of the gate insulation layer 460 and the gate electrode 470, which are adjacent to the N-type drain region 452 among the both ends, may be located on the trench insulation layer 480. Thus, the trench insulation layer 480 may suppress an electric field crowding phenomenon occurring at an edge of the gate electrode 470 which is adjacent to the N-type drain region 452, thereby improving drain junction breakdown voltage characteristics and gate dielectric breakdown voltage characteristics of the second high voltage integrated device 400. In some embodiments, the gate insulation layer 460 may include an oxide layer, and the gate electrode 470 may include a polysilicon layer. The polysilicon layer may be doped with impurities.

Each of sidewalls of the trench insulation layer 480 may have a single-sloped profile. That is, each of the sidewalls of the trench insulation layer 480 may have a constant slope. The slope of each sidewall of the trench insulation layer 480 may be defined by a third angle γ between the sidewall of the trench insulation layer 480 and a third line L3 (i.e., a horizontal line) horizontally extending from the bottom surface of the trench insulation layer 480. In some embodiments, the third angle γ may be within the range of about 55 degrees to about 59 degrees.

Hereinafter, a method of fabricating a high voltage integrated device according to an embodiment will be described with reference to FIGS. 3 to 9.

Figure 3:
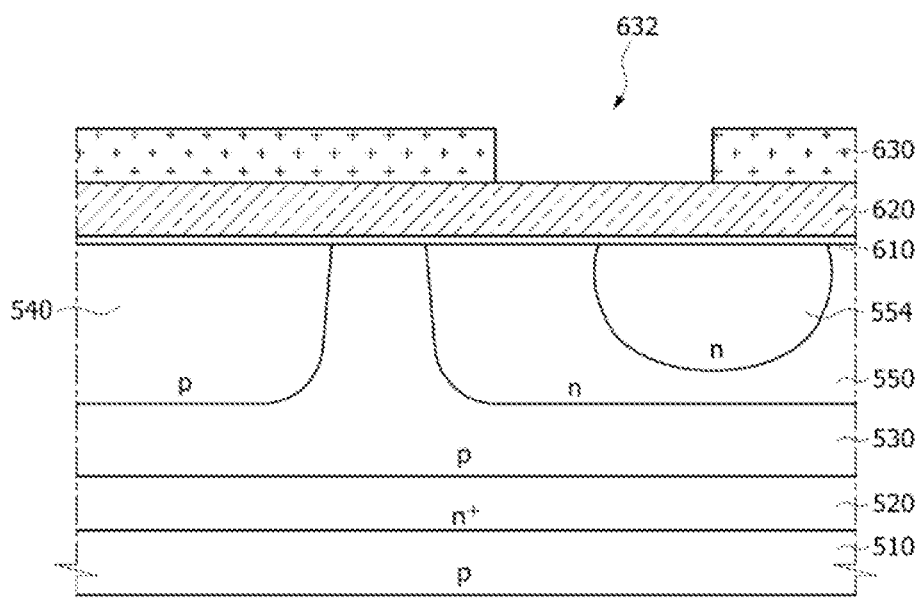
FIG. 3 is a cross-sectional view illustrating a step of forming a mask pattern used in fabrication of a high voltage integrated device according to an embodiment.

FIG. 3 is a cross-sectional view illustrating a step of forming a mask pattern used in fabrication of a high voltage integrated device according to an embodiment. Referring to FIG. 3, an N-type buried layer 520 and a P-type semiconductor layer 530 may be sequentially formed on a P-type substrate 510. The N-type buried layer 520 may be formed using an ion implantation process and a diffusion process. The P-type semiconductor layer 530 may be formed using an epitaxial process. For example, N-type impurities may be implanted into an upper region of the P-type substrate 510 to form an N-type impurity layer for the N-type buried layer 520. Subsequently, the P-type semiconductor layer 530 may be formed using an epitaxial process on the N-type impurity layer formed on the P-type substrate 510. While the P-type semiconductor layer 530 is formed, the N-type impurities in the N-type impurity layer may be diffused into the P-type substrate 510 and the P-type semiconductor layer 530 to form the N-type buried layer 520.

P-type impurities may then be selectively implanted into a portion of the P-type semiconductor layer 530 to form a P-type impurity region for a P-type body region 540. In addition, N-type impurities may be selectively implanted into a portion of the P-type semiconductor layer 530 to form a first N-type impurity region for an N-type drift region 550 and a second N-type impurity region for an N-type diffusion region 554 in the first N-type impurity region. The impurities in the P-type impurity region and the first and second N-type impurity regions may be activated by a diffusion process to form the P-type body region 540, the N-type drift region 550 and the N-type diffusion region 554. The P-type body region 540 and the N-type drift region 550 may be formed to be laterally spaced apart from each other in the P-type semiconductor layer 530, and the N-type diffusion region 554 may be formed in the N-type drift region 550. The P-type body region 540, the N-type drift region 550 and the N-type diffusion region 554 may be exposed at a top surface of the P-type semiconductor layer 530.

A hard mask layer may be sequentially formed on a surface of the substrate including the P-type body region 540, the N-type drift region 550 and the N-type diffusion region 554. In some embodiments, the hard mask layer may be formed by sequentially stacking an oxide layer 610 and a nitride layer 620. A photoresist pattern 630 may be formed on the nitride layer 620. The photoresist pattern 630 may be formed to have an opening 632 that exposes a portion of the nitride layer 620. The opening 632 of the photoresist pattern 630 may define a region where a trench insulation layer is formed in a subsequent process.

Figure 4:
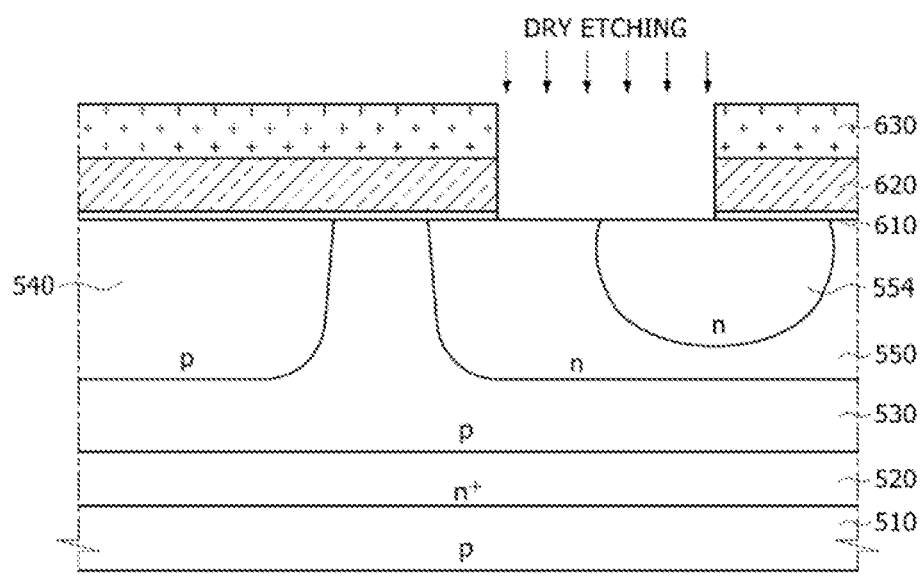
FIGS. 4, 5 and 6 are cross-sectional views illustrating a dry etch process used in fabrication of a high voltage integrated device according to an embodiment.
Figure 5:
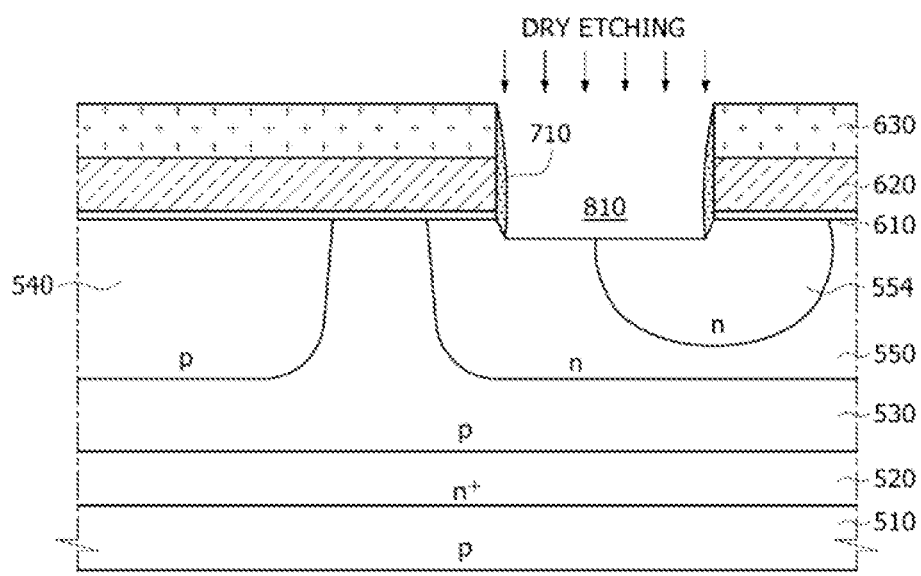
Figure 6:
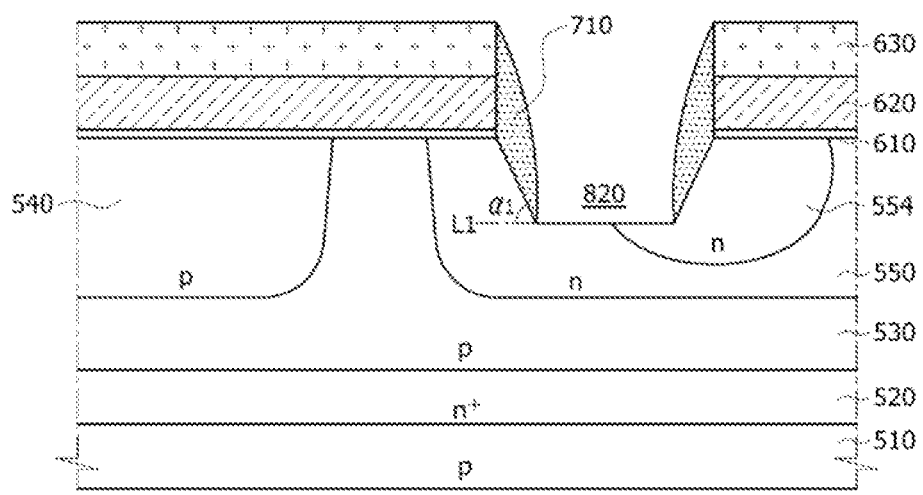

FIGS. 4, 5 and 6 are cross-sectional views illustrating a dry etch process used in fabrication of a high voltage integrated device according to an embodiment. As illustrated in FIG. 4, the nitride layer 620 and the oxide layer 610 may be sequentially etched using the photoresist pattern 630 as an etch mask. As a result a portion of the N-type drift region 550 and a portion of the N-type diffusion region 554 may be exposed. As indicated by arrows in FIG. 4, a dry etch process may be applied to the exposed portions of the N-type drift region 550 and the N-type diffusion region 554. The dry etch process may be performed using an etch gas that generates a polymer material. In some embodiments, the dry etch process may be performed using a hydrocarbon ($C_xH_y$) gas or a fluorocarbon ($C_xF_y$) gas as an etch gas.

As a result of the dry etch process, a polymer material 710 may be continuously generated and deposited on sidewalls of the oxide layer 610, the nitride layer 620 and the photoresist pattern 630 while the exposed portions of the N-type drift region 550 and the N-type diffusion region 554 are vertically etched to form an initial trench 810, as illustrated in FIG. 5. Accordingly, the initial trench 810 may be formed to have sloped side ails due to generation of the polymer material 710 at an initial stage of the dry etch process. Subsequently, the thickness of the polymer material 710 in a lateral direction may increase as the dry etch process is continuously performed, as illustrated in FIG. 6. Thus, sidewalls of a preliminary trench 820 having a predetermined depth may also be formed to maintain a constant slope. After the preliminary trench 820 having the predetermined depth is formed, the dry etch process may be terminated.

Figure 7:
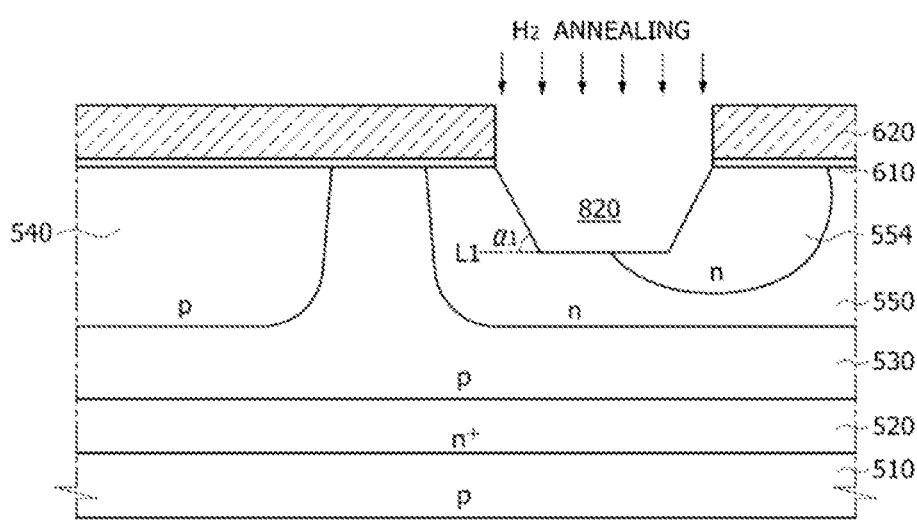
FIG. 7 is a cross-sectional view illustrating a hydrogen annealing process used in fabrication of a high voltage integrated device according to an embodiment.

FIG. 7 is a cross-sectional view illustrating a hydrogen annealing process used in fabrication of a high voltage integrated device according to an embodiment. Referring to FIG. 7, the photoresist pattern 630 and the polymer material 710 may be removed after the dry etch process is terminated. The photoresist pattern 630 and the polymer material 710 may be removed using an ashing process. The sidewalls of the preliminary trench 820 may have a first angle α1 to a first line L1 (i.e., a horizontal line) horizontally extending from a bottom surface of the preliminary trench 820. The preliminary trench 820 may be formed by appropriately controlling etch conditions of the dry etch process so that the first angle α1 is about 57 degrees. Even though the etch conditions of the dry etch process are accurately controlled, the first angle α1 may exhibit a value within a certain error range according to a relative position of the substrate 510 (or a wafer), i.e., according to where the substrate 510 is loaded into a process chamber of an etch apparatus in which the dry etch process is performed. For example, the first angle α1 may exhibit a value of about 57° and an error range of the first angle α1 may be about ±10°. This wide error range of the first angle α1 may disturb fabrication of high voltage integrated devices having uniform and stable characteristics. A hydrogen annealing process may be applied to the resultant including the preliminary trench 820 to reduce the error range of the first angle α1 as indicated by arrows in FIG. 7. The hydrogen annealing process may be performed by supplying a hydrogen gas onto the substrate including the preliminary trench 820 at a high temperature.

Figure 8:
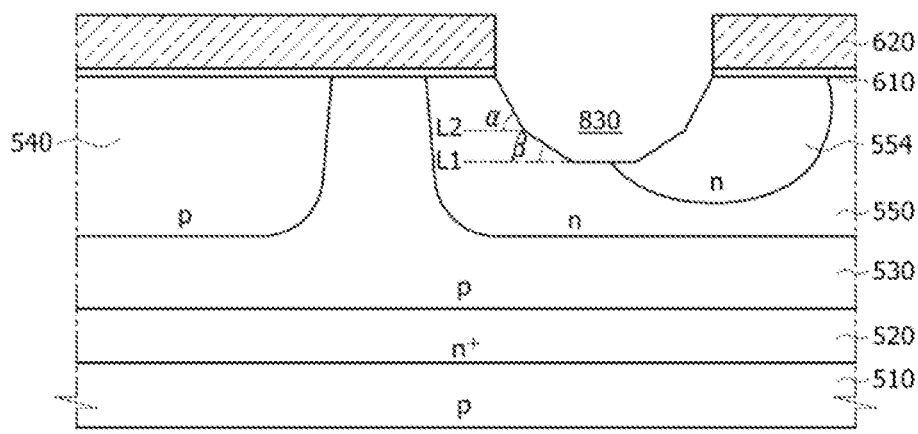
FIG. 8 is a cross-sectional view illustrating a trench which is formed by the hydrogen annealing process shown in FIG. 7.

FIG. 8 is a cross-sectional view illustrating a final trench 830 which is formed by the hydrogen annealing process. As illustrated in FIG. 8, if the hydrogen annealing process is performed, a native oxide layer on an inner surface of the preliminary trench 820 may be removed and silicon atoms adjacent to the inner surface of the preliminary trench 820 may be migrated and redistributed in a specific direction. As a result of the hydrogen annealing process, each of the sidewalls of the preliminary trench 820 may be deformed to have a dual-sloped sidewall profile which is defined by a first angle α and a second angle β, thereby forming the final trench 830. The first angle α may correspond to an angle between an upper sidewall of the trench 830 and a second line L2 parallel with a first line L1 (i.e., a horizontal line) horizontally extending from a bottom surface of the trench 830. The second angle r may correspond to an angle between a lower sidewall of the trench 830 and the first line L1. As a result of the hydrogen annealing process, the first angle may exhibit a value which is within a range of about 57°±2°, and the second angle β may exhibit a value which is within a range of about 26°±2°. After the trench 830 is formed, the nitride layer 620 and the oxide layer 610 may be removed.

Figure 9:
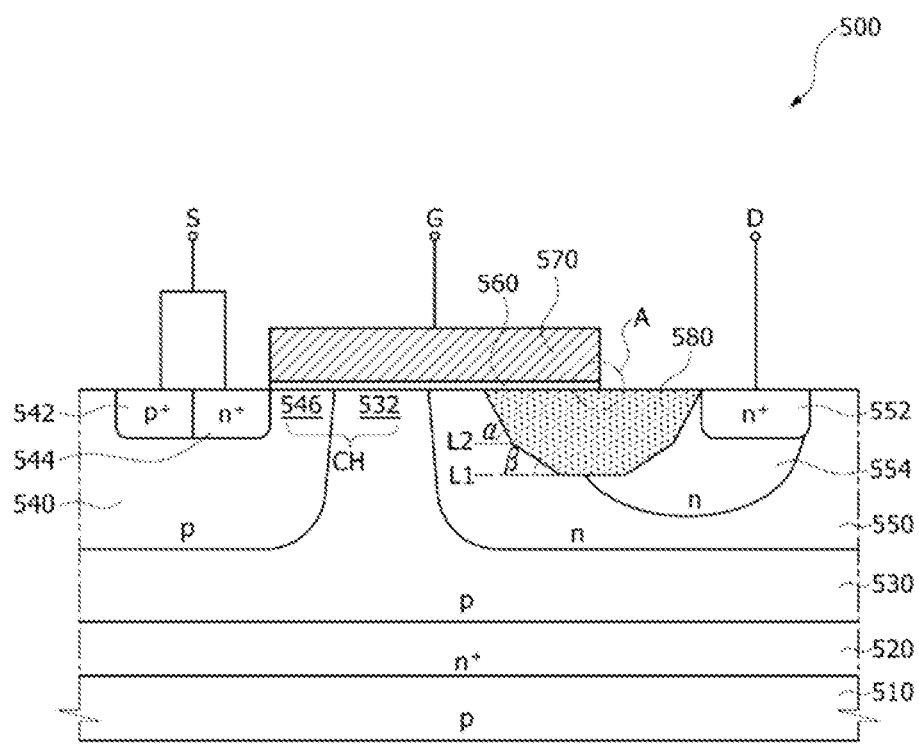
FIG. 9 is a cross-sectional view illustrating a step of forming a trench insulation layer in fabrication of a high voltage integrated device according to an embodiment.

FIG. 9 is a cross-sectional view illustrating a step of forming a trench insulation layer 580. As illustrated in FIG. 9 an insulation layer, for example, an oxide layer may be formed in the trench 830 to provide the trench insulation layer 580 having a dual-sloped sidewall profile. Subsequently, a gate insulation layer 560 and a gate electrode 570 may be sequentially formed on a top surface of a portion (i.e., a first channel region 546) of the P-type body region 540 adjacent to the P-type semiconductor layer 530 and a top surface of a portion (i.e., a second channel region 532) of the P-type semiconductor layer 530 adjacent to the first channel region 546. The gate insulation layer 560 and the gate electrode 570 may be formed to extend onto the trench insulation layer 580. The first and second channel regions 546 and 532 may constitute a channel region CH. Thereafter, P-type impurities and N-type impurities may be implanted into the P-type body region 540 and the N-type diffusion region 554 using the gate electrode 570 and the trench insulation layer 580 as implantation masks, thereby forming a P-type body contact region 542, an N-type source region 544 and an N-type drain region 552.

Figure 10:
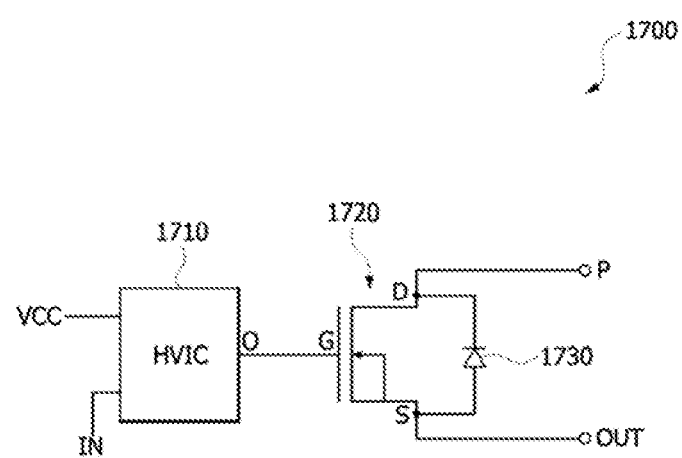
FIG. 10 is a schematic view illustrating an electronic device employing a high voltage integrated device according to an embodiment of the present disclosure.

FIG. 10 is a schematic view illustrating an electronic device 1700 employing a high voltage integrated device according to an embodiment of the present disclosure. Referring to FIG. 10, the electronic: device 1700 may include a high voltage integrated circuit (HVIC) 1710 acting as a driver circuit and a high voltage integrated device 1720 acting as a switching device. This electronic device 1700 may correspond to a single phase inverter. The HVIC 1710 may have a supply voltage terminal VCC, an input terminal IN and an output terminal O. The HVIC 1710 may receive a power supply voltage signal through the supply voltage terminal VCC to drive the internal circuits thereof. In addition, the HVIC 1710 may receive an input signal through the input terminal IN to generate an output signal. The output signal may be outputted through the output terminal O. The output terminal O may be connected to a gate terminal G of the high voltage integrated device 1720.

The high voltage integrated device 1720 may be any one of the high voltage integrated devices, that is, the LDMOS transistors which are described with reference to FIGS. 1 and 2. Thus, the high voltage integrated device 1720 may include a trench insulation layer having a dual-sloped sidewall profile. As described with reference to FIG. 1, the trench insulation layer may include upper sidewalls having a first slope and lower sidewalls having a second slope which is less steep than the first slope. Accordingly, the drift length of carriers drifted along sidewalls and a bottom surface of the trench insulation layer may be reduced as compared to when the trench insulation layer has vertical sidewalls or single-sloped sidewalls with the first slope. As a result, on-resistance (Ron) characteristics of the high voltage integrated device 1720 may be improved. Moreover, the sharpness of lower corners of the trench insulation layer may be dulled because of the presence of the lower sidewalls of the trench insulation layer. Accordingly, an electric field crowding phenomenon occurring at corners of the trench insulation layer may be suppressed.

The high voltage integrated device 1720 may include a drain terminal D connected to a power supply terminal P to which a power supply voltage is applied. Moreover, the high voltage integrated device 1720 may include a source terminal S connected to an output terminal OUT. A freewheeling diode 1730 may be coupled in anti-parallel between the drain terminal D and the source terminal S of the high voltage integrated device 1720. The output signal of the HVIC 1710 may be applied to the gate terminal G of the high voltage integrated device 1720 to turn on or turn off the high voltage integrated device 1720. If the electronic device 1700 is a multi-phase inverter, the electronic device 1700 may include a plurality of HVICs 1710 and a plurality of high voltage integrated devices 1720. The number of HVICs 1710 and the number of high voltage integrated devices 1720 may be equal to the number of the phases.

Figure 11:
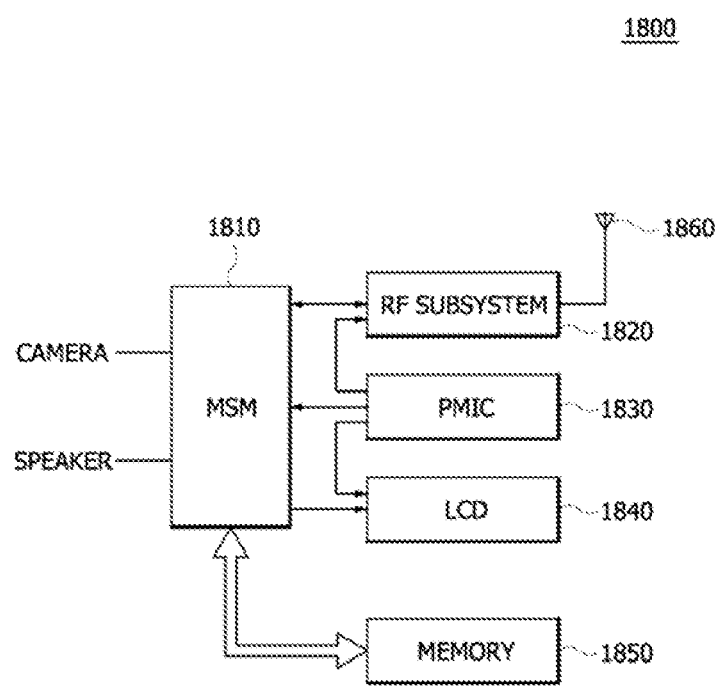
FIG. 11 is a block diagram illustrating an electronic system employing a high voltage integrated device according to an embodiment of the present disclosure.

FIG. 11 is a block diagram illustrating an electronic system 1800 employing a high voltage integrated device according to an embodiment of the present disclosure. Referring to FIG. 11 the electronic system 1800 may correspond to an example ref mobile systems and may include a mobile station modem (MSM) 1810, an radiofrequency (RF) subsystem 1820, a power management integrated circuit (PMIC) 1830, a display 1840 such as a liquid crystal display (LCD), and a memory 1850. The MSM 1810 may include a processor for controlling overall operations of the electronic system 1800, a digital signal processor (DSP) for processing audio signals and video signals, a modem for communication, and a driver. The RF subsystem 1820 may be used to stably set a frequency band available for the electronic system 1800 and may be used to convert an analog signal into a digital signal or vice versa. The display 1840 may be used as an output unit of the electronic system 1800. The memory 1850 may include a mobile dynamic random access memory (DRAM) and a NAND flash memory that store data which are used in operation of the electronic system 1800. The memory 1850 may communicate with the MSM 1810 through a bidirectional bus.

The electronic system 1800 may further include a camera, a speaker and an antenna 1860. The camera and the speaker may be controlled by the MSM 1810. Images captured by the camera may be stored in the memory 1850, and image data stored in the memory 1850 may be outputted through the display 1840. The RF subsystem 1820 may convert signals received through the antenna 1860 into analog signals or digital signals. Audio signals of the signals received through the antenna 1860 may be outputted through the speaker.

The PMIC 1830 may receive a power supply voltage from an external device or a battery to supply the power supply voltage to the various internal elements of the electronic system 1800. Thus, the PMIC 1830 may include a power management circuit that employs at least one of the high voltage integrated devices illustrated in FIGS. 1 and 2 as a switching device. In some embodiments, the power management circuit may include a regulator, an inverter, a converter or a driver.

The embodiments of the present disclosure have been presented for illustrative purposes. Those of ordinary skill in the art will appreciate that various modifications, additions, and substitutions are possible, without departing from the scope and spirit of the present disclosure as disclosed in the accompanying claims.

What is claimed is:

1. A high voltage integrated device comprising:
   a first channel region in an upper region of a substrate;
   a first drift region in the upper region of the substrate and adjacent to a side of the first channel region;
   a first source region in the upper region of the substrate, in contact with the other side of the first channel region, and opposite to the first drift region;
   a first drain region in an upper region of the first drift region;
   a first trench insulation layer in the upper region of the first drift region between the first channel region and the first drain region; and
   a first gate insulation layer and a first gate electrode sequentially stacked on the first channel region and extending onto the first trench insulation layer,
   wherein the upper sidewall of the first trench insulation layer has a first angle to the bottom surface thereof and the lower sidewall of the first trench insulation layer has a second angle, which is smaller than the first angle, to the bottom surface thereof.

2. The high voltage integrated device of claim 1, wherein the first angle is within a range of about 55° to about 59°.

3. The high voltage integrated device of claim 2, wherein the second angle is within a range of about 24° to about 28°.

4. The high voltage integrated device of claim 1, wherein the first trench insulation layer is exposed at a top surface of the first drift region.

5. The high voltage integrated device of claim 1, wherein a top surface of the first trench insulation layer is coplanar with a top surface of the first drift region.

6. The high voltage integrated device of claim 1, wherein the high voltage integrated device includes:
   a first high voltage integrated device in a high voltage region; and
   a second high voltage integrated device in a low voltage region,
   wherein the first high voltage integrated device includes the first channel region, the first drift region, the first source region, the first drain region, the first trench insulation layer, the first gate insulation layer and the first gate electrode.

7. The high voltage integrated device of claim 6, wherein the second high voltage integrated device comprises:
   a second channel region in the upper region of the substrate;
   a second drift region in the upper region of the substrate and adjacent to a side of the second channel region;
   a second source region in the upper region of the substrate that is in contact with the other side of the second channel region and opposite to the second drift region;
   a second drain region in an upper region of the second drift region;
   a second trench insulation layer in the upper region of the second drift region between the second channel region and the second drain region; and
   a second gate insulation layer and a second gate electrode sequentially stacked on the second channel region and extending onto the second trench insulation layer,
   wherein the second trench insulation layer has a single-sloped sidewall profile which is defined by sidewalls having a third angle to a bottom surface thereof.

8. The high voltage integrated device of claim 7, wherein the third angle is within a range of about 55° to about 59°.

9. A method of fabricating a high voltage integrated device, the method comprising:
- forming a body region and a drift region in an upper region of a substrate to be spaced apart from each other;
- forming a trench having a predetermined depth in the drift region, the trench being formed to have a dual-sloped sidewall profile which is defined by upper and lower side ails having different angles to a bottom surface thereof;
- forming a trench insulation layer in the trench;
- sequentially forming a gate insulation layer and a gate electrode on a top surface of a portion of the body region adjacent to the drift region and a top surface of the substrate between the body region and the drift region, the gate insulation layer and the gate electrode extending onto the trench insulation layer; and
- forming a source region and a drain region in the body region and the drift region, respectively wherein the upper sidewall of the first trench insulation layer has a first angle to the bottom surface thereof and the lower sidewall of the first trench insulation layer has a second angle, which is smaller than the first angle, to the bottom surface thereof.

10. The method of claim 9, wherein the forming of the trench includes:
- etching a portion of the drift region with a dry etch process to form a preliminary trench having a sloped sidewall profile; and
- applying a hydrogen annealing process to the substrate including the preliminary trench.

11. The method of claim 10, wherein the dry etch process is performed using an etch gas that generates a polymer material.

12. The method of claim 11, wherein the each gas includes a hydrocarbon ($C_xH_y$) gas or a fluorocarbon ($C_xF_y$) gas.

* * * * *